US011467201B2

(12) United States Patent
Dzienis et al.

(10) Patent No.: US 11,467,201 B2
(45) Date of Patent: Oct. 11, 2022

(54) METHOD, DEVICE AND SYSTEM FOR DETERMINING THE FAULT POSITION OF A FAULT ON A LINE OF AN ELECTRICAL POWER SUPPLY NETWORK

(71) Applicant: Siemens Aktiengesellschaft, Munich (DE)

(72) Inventors: Cezary Dzienis, Dallgow-Doeberitz (DE); Andeas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 62 days.

(21) Appl. No.: 16/697,599

(22) Filed: Nov. 27, 2019

(65) Prior Publication Data
US 2020/0166559 A1 May 28, 2020

(30) Foreign Application Priority Data

Nov. 27, 2018 (EP) .................................. 18208595

(51) Int. Cl.
*G01R 31/08* (2020.01)
*G01R 19/25* (2006.01)

(52) U.S. Cl.
CPC ....... *G01R 31/088* (2013.01); *G01R 19/2506* (2013.01); *G01R 31/085* (2013.01); *G01R 31/086* (2013.01)

(58) Field of Classification Search
CPC .. G01R 31/088; G01R 31/085; G01R 31/086; G01R 19/2506
See application file for complete search history.

(56) References Cited

U.S. PATENT DOCUMENTS

| 6,798,211 | B1* | 9/2004 | Rockwell | ............. | G01R 31/085 |
| | | | | | 324/527 |
| 7,755,371 | B2* | 7/2010 | Wells | ..................... | G01R 27/16 |
| | | | | | 324/713 |
| 8,655,609 | B2 | 2/2014 | Schweitzer, III et al. | | |
| 10,228,408 | B2 | 3/2019 | Dzienis et al. | | |
| 10,725,085 | B2* | 7/2020 | Dzienis | ............... | G01R 31/086 |

(Continued)

FOREIGN PATENT DOCUMENTS

| EP | 3193420 A1 | 7/2017 |
| EP | 3223026 A1 | 9/2017 |
| EP | 3477808 A1 | 5/2019 |

*Primary Examiner* — Judy Nguyen
*Assistant Examiner* — Joseph O Nyamogo
(74) *Attorney, Agent, or Firm* — Laurence A. Greenberg; Werner H. Stemer; Ralph E. Locher

(57) ABSTRACT

A method determines a fault position on a line of a power supply network. Transient profiles of current and voltage values are measured at the line ends of the line and, by using the transient profiles, after the occurrence of a fault, a fault position is determined. To carry out fault location with high accuracy even in the case of a line having more than two line ends, transient profiles of a node current and a node voltage at a node point are determined by using the current and voltage values of a line end and a traveling wave model for the respective line section, and, for each line section, a two-sided fault position determination is carried out using the transient profile of the current and voltage values measured at its line end and, the node current and the node voltage and the traveling wave model for this line section.

15 Claims, 7 Drawing Sheets

(56) References Cited

U.S. PATENT DOCUMENTS

| | | | |
|---|---|---|---|
| 2010/0301872 A1* | 12/2010 | Kereit | H02H 7/28 324/521 |
| 2015/0081235 A1* | 3/2015 | Schweitzer, III | H02H 7/265 702/59 |
| 2017/0199237 A1 | 7/2017 | Dzienis et al. | |
| 2017/0276718 A1* | 9/2017 | Dzienis | G01R 31/086 |
| 2019/0120892 A1 | 4/2019 | Dzienis et al. | |

* cited by examiner

METHOD, DEVICE AND SYSTEM FOR DETERMINING THE FAULT POSITION OF A FAULT ON A LINE OF AN ELECTRICAL POWER SUPPLY NETWORK

CROSS-REFERENCE TO RELATED APPLICATION

This application claims the priority, under 35 U.S.C. § 119, of the European application EP 18208595.1, filed Nov. 27, 2018; the prior application is herewith incorporated by reference in its entirety.

BACKGROUND OF THE INVENTION

Field of the Invention

The invention relates to a method for determining the fault position of a fault on a line of an electrical power supply network, wherein transient profiles of current and voltage values are measured at the line ends of the line by measuring devices, and, by using the transient profiles of current and voltage values, after the occurrence of a fault on the line, the fault position thereof is determined. The invention also relates to a device for carrying out such a method and to system having such a device.

The safe operation of electrical power supply networks requires rapid and reliable identification and shutdown of any faults, for example short circuits or ground faults. Fault causes which lead to a shutdown may for example be lightning strikes, torn or otherwise damaged lines, defective insulations on cable lines or accidental touching of overhead lines by parts of animals or plants. In order to shorten downtimes due to faults, such faults must be localized as accurately as possible, in order to make it possible for a maintenance team to remedy the fault cause and any consequential damage caused by the fault.

The fault position at which the fault on the line is situated may be localized by analysis of measurement quantities, for example currents and voltages, recorded during the occurrence of the fault. To this end, several different methods are currently known, the accuracy of which has a significant effect on the maintenance outlay of the power supply network. Great importance is therefore attached to improving the accuracy of the algorithms used for the fault location, in order to facilitate maintenance and, in particular, to shorten fault-related downtimes of the power supply network.

Methods for more accurate fault location use, for example, the measured current and voltage signals of the fundamental wave (50 Hz or 60 Hz signals) for fault location. In this case, methods are known which use measurement values of only one of the line ends (one-sided fault location) or measurement values of both line ends (two-sided fault location). As a result, the fault position is generally indicated as a distance from the respective measurement site (as a percentage of the line or in km or miles). In the case of using measurement values of only one line end, the outlay for carrying out the fault location is low. This fault location method is predominantly an impedance-based method, in which an impedance as far as the fault position is calculated from current and voltage measurement values. By comparison with the line impedance of the overall line in the fault-free case, it is possible to draw a conclusion about the fault position. One exemplary embodiment of such a fault location method may, for example, be found in U.S. Pat. No. 4,996,624 A. The accuracy of this method depends, inter alia, strongly on the measurement accuracy of the current and voltage transformers used, the accuracy of the line parameters (for example impedance per unit length) used for the fault location as well as on the existing fault conditions (for example fault resistance, load) and the network condition. Perturbations and the transient processes in the current and voltage signals may have a negative effect on the accuracy of this method. The measurement errors thereby incurred may amount to several percent. An improved accuracy in the fault location may be achieved by the use of measurement values of both line ends. In this case, the fault location-related measurement values need to be combined by means of a suitable communication connection. In this context, reference is made to the U.S. Pat. No. 5,929,642; in the method described therein, a very high accuracy (measurement error about 1-2%) in the fault location is achieved by using current and voltage measurement values of both line ends with the aid of estimation methods and nonlinear optimization methods.

While the accuracy of the fault location in the impedance-based fault location methods depends on the measurement accuracy of the measuring transformers used and the network condition, by using a fault location method according to the so-called traveling wave principle ("traveling wave fault location"), a substantial independency from these quantities can be achieved. According to this principle, instead of the fundamental waves of the measured current and voltage signals, the transient signal components occurring in the case of a fault, which arise in the form of so-called "traveling waves", are taken into account for the fault location. In this case, the high-frequency traveling wave edges are recorded by measurement and provided with a timestamp. Since the propagation speed of the traveling waves is approximately the speed of light, the location of the fault can be carried out well from evaluation of the time stamping. With this fault location method, accuracies in the range of a few dozen meters can be achieved. One example of a such fault location method may be found in U.S. Pat. No. 8,655,609 B2.

Another method for fault location with traveling waves, in which pattern recognition of longer time profiles of current and/or voltage is carried out instead of the edges, is furthermore known for example from published European patent application EP 3 193 420 A1, corresponding to U.S. patent publication No. 2017/0199237.

The aforementioned fault location methods are suitable particularly for linear network topologies without branching, i.e. for lines having two line ends. However, the rapid integration of renewable energy sources into, and the upgrading of, existing power networks in many situations require the construction of network topologies which differ from a conventional linear configuration. In this case, branched configurations are often created, which may be regarded as a combination of a plurality of three-legged structures (or T structures) having more than two line ends. These also enjoy great popularity for economic reasons. Often, such structures—even in comparison with the linear network topology—represent the only practicable alternative for a required network upgrade. The number of power supply networks which at least partially comprise the described branched structures is therefore increasing.

However, such branched structures of the network topology represent a great challenge in terms of network management, network monitoring and network protection. In particular, false reactions of protection devices may occur in the case of complex branched structures, so that, for example, in the event of a network fault a correct shutdown of the affected line section can no longer be ensured.

Difficulties also arise in the locating of the fault in such network structures, so that the results of a fault location are often unreliable which leads to considerable outlays in the maintenance of the lines.

SUMMARY OF THE INVENTION

On the basis of a method and a device of the type specified in the introduction, the object of the invention is to be able to carry out fault location in the case of a line having more than two line ends, with high accuracy even if measurements are not carried out at all positions of the line.

This object is achieved by a method of the type specified in the introduction, in which the line contains a first line section having a first line end, a second line section having a second line end and at least one further line section having a further line end, as well as at least one node point, at which more than two line sections meet. Transient profiles of a node current and a node voltage at the at least one node point are determined by using at least the current and voltage values of a line end as well as a traveling wave model for the respective line section, and for each line section, a two-sided fault position determination is carried out by using on the one hand the transient profile of the current and voltage values measured at its line end and, on the other hand, the node current and the node voltage as well as the traveling wave model for this line section.

In this way, the complex branched structure may so to speak be reduced to the consideration of a plurality of line sections each having two ends. Since measurement values are usually not recorded at the node points, and the retrofitting of corresponding measuring apparatuses which are capable of recording transient profiles would entail high costs, according to the invention the current and voltage at the node point are determined computationally with the aid of the measurements existing at the line ends. In this way, the transient profiles of current and voltage initially missing for the two-sided fault location at the node point may be added and subsequently used together with the existing measurement values for determining the fault position. By the use of transient profiles according to the traveling wave principle, it is furthermore possible to exclude problems with the formation of current and voltage phasors of the fundamental oscillation, which occur particularly in branched structures because not all the line sections are shut down entirely synchronously and transitional effects therefore vitiate the measurement of the signals in the fundamental oscillation.

According to one advantageous embodiment of the method according to the invention, during the determination of the node current and the node voltage, the current and voltage values of that line end which delimits the respectively considered line section are excluded.

The effect achievable in this way is that, for fault location, those measurement values which would vitiate a fault position determination, since the traveling wave model would in this case deliver a false result for the node voltage and node current, are excluded.

According to one advantageous embodiment, the fault position determination may be carried out with the aid of a time difference with which a current or voltage edge of a traveling wave arrives at the two ends of the respective line section.

In this way, the two-sided fault location with the measured or calculated transient profiles may be carried out in a straightforward way.

In the method according to the invention, in the event of a fault existing, fault location is carried out for each line section since the line section on which the fault specifically exists is initially not known. Since it is usual that only one line section will in fact be affected by a fault, it is important to select the correct line section and therefore the correct fault position. According to a further advantageous embodiment of the method according to the invention, therefore, possible fault positions are respectively determined by the fault position determination for the individual line sections, and that possible fault position for which the fault position determination most clearly indicates a fault existing at a particular location in comparison with the other possible fault positions is selected as the actual fault position.

In principle, specifically, with the fault position determination carried out for each line section of the line, one possible fault position is determined per line section. However, since the fault usually in fact exists at only one position on the line, the actual fault position must be deduced from the multiplicity of possible fault positions. In the present case, this is done by comparing the results of the fault position determination of the individual line sections and selecting the most conclusive result to specify the actual fault position. The correct (actual) fault position is consequently determined by comparing the results of the respective fault position determination for the individual line sections, by the results for the individual line sections being compared with one another. The most conclusive result is regarded as an indication of the actual fault position.

In this context, it is furthermore regarded as advantageous if, for the fault position determination, for each line section a check is made as to whether there is a position over the length of the latter at which time profiles, calculated from the two ends of the line section, of a voltage existing at this location and/or of a current existing at this location match; and such a location is used as a possible fault position for the respective line section.

In this case, a method for two-sided fault location as described in published European patent application EP 3 223 026 A1 (corresponding to U.S. Pat. No. 10,228,408), which was described in the introduction, is therefore used. The advantage of this method is that not just single edges of the transient currents and voltages, but longer time profiles are used for the fault location. By pattern comparison, it is possible to identify whether there is a match of the profiles of the two line ends of the selected fault position.

In this context, for example, the determination of the possible fault position may be carried out by an optimization method, the fault position being used as an optimization variable of a target function of the optimization method.

In this way, the actual fault position may be determined with tolerable computation outlay by mathematical optimization (for example minimization or maximization of the target function). In this case, the optimization method may, for example, be an iterative optimization method.

Specifically, in this context, provision may for example be made that minimization of a target function in the form of a difference of the time profiles calculated from the respective ends of the respective line section is carried out, and that location at which the target function assumes a minimum is regarded as a possible fault position on the respective line section.

With this procedure, the best possible overlap of the profiles of the traveling waves of the two line ends may be found, in order to deduce the time difference of the arrival of the traveling waves therefrom.

As an alternative, provision may also be made that maximization of a target function in the form of a product of the time profile of one end of the respective line section and the complex conjugate profile of the time profile of the other end of the line section is carried out, and that location at which the target function assumes a maximum is regarded as a possible fault position on the respective line section.

In the latter case, the target function describes a so-called cross power spectrum, which is formed in the described way in the frequency domain. In the time domain, the target function corresponds to a cross-correlation of the profiles determined by the two line ends.

Furthermore, other target functions may also be envisioned, with which the notional fault position at which the two profiles of the fault voltage values most greatly match can be determined.

In this context, according to a further advantageous embodiment of the method according to the invention, the profiles of the target functions of all the line sections may be compared with one another, and that possible fault position whose target function has a global extremum in comparison with the target functions of the other possible fault positions may be selected as the actual fault position.

In this way, a selection may particularly straightforwardly be carried out from the possible fault positions in order to specify the actual fault position, since only the global minimum or maximum of the profiles of the target functions needs to be used as a criterion for the selection. The greatest maximum value or smallest minimum value for all the target functions considered is regarded as a global extremum.

According to a further advantageous embodiment of the method according to the invention, furthermore, in the case of a line having more than one node point, the transient profiles of the respective node current and of the respective node voltage are determined for each node point, and a two-sided fault position determination is carried out on line sections lying between two node points by using the transient profiles, determined for the respective node points, of the node current and of the node voltage.

The node currents and voltages are therefore initially determined for all the node points from the measured currents and voltages. For those line sections which do not have an end at which measured values exist, fault position determination may then be carried out with the aid of the node currents and voltages determined for the node points.

According to a further advantageous embodiment of the method according to the invention, the node current and the node voltage, in the case of a line section which is configured partially as an overhead line and partially as an underground cable, may be determined with the aid of a traveling wave model which takes into account line parameters both of the overhead line and of the underground cable.

In this way, using suitable line parameters, which are valid on the one hand for the overhead line and on the other hand for the underground cable, it is also possible to apply a traveling wave model for such a mixed line section. To this end, for example, the line section in question can be subdivided into a plurality of (at least two) segments, and the parameters may be determined per segment and combined by concatenation to form the overall model of the line.

According to a further advantageous embodiment of the method according to the invention, the current and voltage values measured at the line ends are subjected to filtering, filtered current and voltage values being formed, which indicate a selected frequency range of the measured current and voltage values.

In this way, advantageously only the signal components relevant for the traveling waves may be determined and used for the fault location. Specifically, in this embodiment only selected signal components of the current and voltage measurement values in a suitable frequency range are used for the fault location, according to the filter configuration.

In this context, specifically, the selected frequency range may comprise high-frequency transient components or band-limited transient components of the measured current and voltage values.

Furthermore, in this context provision may be made that the filter characteristic of the filter used for filtering the current and voltage values attenuates those frequency ranges in which current or voltage transformers used for measuring the current and voltage measurement values have measurement errors.

In this way, measurement errors which are attributable to the current or voltage transformers may be suppressed particularly effectively.

Lastly according to a further advantageous embodiment of the method according to the invention, provision may also be made that the current and voltage values at the line ends are recorded by sampling analog current and voltage signals with a sampling frequency above the fundamental frequency of the signals, preferably with a sampling rate of between 8 kHz and 64 kHz.

In this way, it is possible to ensure that the high-frequency transient signals can be correctly recorded and processed further. In this case, higher sampling rates are in principle to be preferred.

The object mentioned above is also achieved by a device for determining the fault position of a fault on a line of an electrical power supply network, having a measuring arrangement which is adapted to measure transient profiles of current and voltage values at a line end of the line, and a computing device which is adapted, by using the transient profiles, measured by the measuring arrangement, of the current and voltage values, after the occurrence of a fault on the line, to determine the fault position of the latter.

According to the invention, the line contains a first line section having a first line end, a second line section having a second line end and at least one further line section having a further line end, as well as at least one node point, at which more than two line sections meet, the computing device is adapted to determine transient profiles of a node current and a node voltage at the at least one node point by using at least the current and voltage values of a line end as well as a traveling wave model for the respective line section, and the computing device is adapted, for each line section, to carry out a two-sided fault position determination by using on the one hand the transient profile of the current and voltage values measured at its line end and, on the other hand, the node current and the node voltage as well as the traveling wave model for this line section.

In respect of the device according to the invention, all comments made above and below regarding the method according to the invention apply, and vice versa, in a corresponding way; in particular, the device according to the invention is configured for carrying out the method according to the invention in any desired embodiment or a combination of desired embodiments. In respect of the advantages of the device according to the invention, reference is also made to the advantages described regarding the method according to the invention.

Furthermore, the object mentioned above is also achieved by a system for determining the fault position of a fault on a line of an electrical power supply network, having a plurality of measuring devices which are adapted to measure transient profiles of current and voltage values at the line ends of the line, and at least one computing device which is adapted, by using the transient profiles of the current and voltage values, after the occurrence of a fault on the line, to determine the fault position of the latter.

According to the invention, the line contains a first line section having a first line end, a second line section having a second line end and at least one further line section having a further line end, as well as at least one node point, at which more than two line sections meet. The computing device is adapted to determine transient profiles of a node current and a node voltage at the at least one node point by using at least the current and voltage values of a line end as well as a traveling wave model for the respective line section. The computing device is also adapted, for each line section, to carry out a two-sided fault position determination by using on the one hand the transient profile of the current and voltage values measured at its line end and, on the other hand, the node current and the node voltage as well as the traveling wave model for this line section.

In respect of the system according to the invention, all comments made above and below regarding the method according to the invention and the device according to the invention apply, and vice versa, in a corresponding way; in particular, the system according to the invention is configured for carrying out the method according to the invention in any desired embodiment or a combination of desired embodiments. In respect of the advantages of the system according to the invention, reference is also made to the advantages described regarding the method according to the invention.

The invention will be explained in more detail below with the aid of an exemplary embodiment. The specific configuration of the exemplary embodiment is to be understood as in no way restrictive for the general configuration of the method according to the invention and of the device according to the invention; rather, individual configuration features of the exemplary embodiment may be freely combined in any desired way with one another and with the features described above.

Other features which are considered as characteristic for the invention are set forth in the appended claims.

Although the invention is illustrated and described herein as embodied in a method, a device and a system for determining the fault position of a fault on a line of an electrical power supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
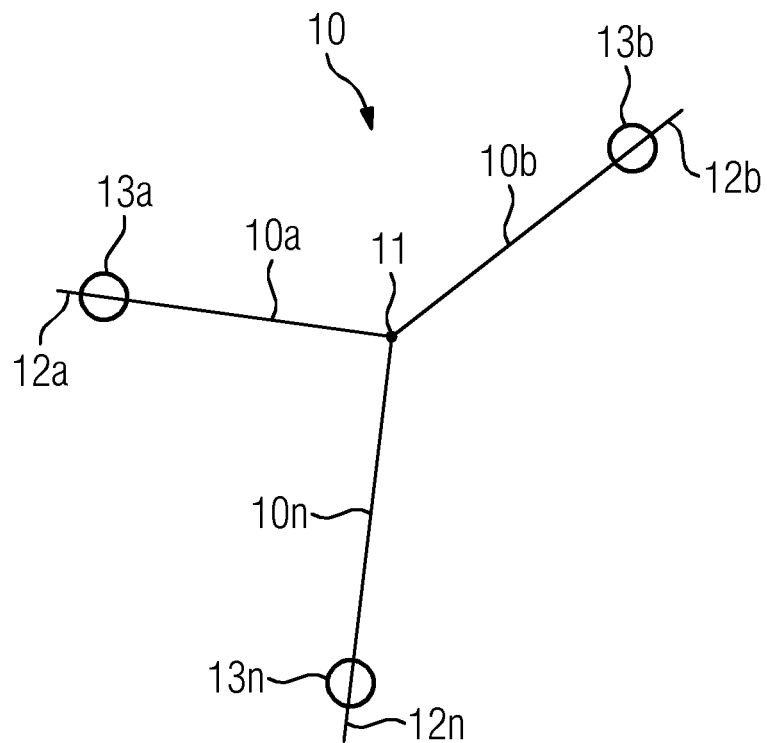
FIG. 1 is a diagrammatic, illustration of a line of an electrical power supply network with three line sections meeting at a node point.

Referring now to the figures of the drawings in detail and first, particularly to FIG. 1 thereof, there is shown a schematic view of a line 10 of an electrical power supply network configured in a branched fashion. Although a single-phase line is represented in FIG. 1, the power supply network may also be configured to be polyphase, in particular three-phase. The line 10 contains three line sections 10a, 10b, 10n, which meet at a common node point 11. At their line ends 12a, 12b, 12n facing away from the node point 11, measurement sites 13a, 13b, 13n are provided, at which currents and voltages are recorded with suitable sensors and forwarded to devices (not shown in FIG. 1) for determining a fault position on the line. The devices may, for example, be intelligent electronic devices (IEDs) in the form of electrical protection apparatuses or fault recorders. It is furthermore possible for the currents and voltages recorded at the line ends to be forwarded to a central device for determining the fault position. This may consist of one or more computing devices or a cloud platform (for example Mindsphere Cloud of Siemens AG).

FIG. 1 shows a relatively simple example of a branched line, namely a so-called "three-legged topology". This may be regarded as the building block of branched network topologies.

Figure 2:
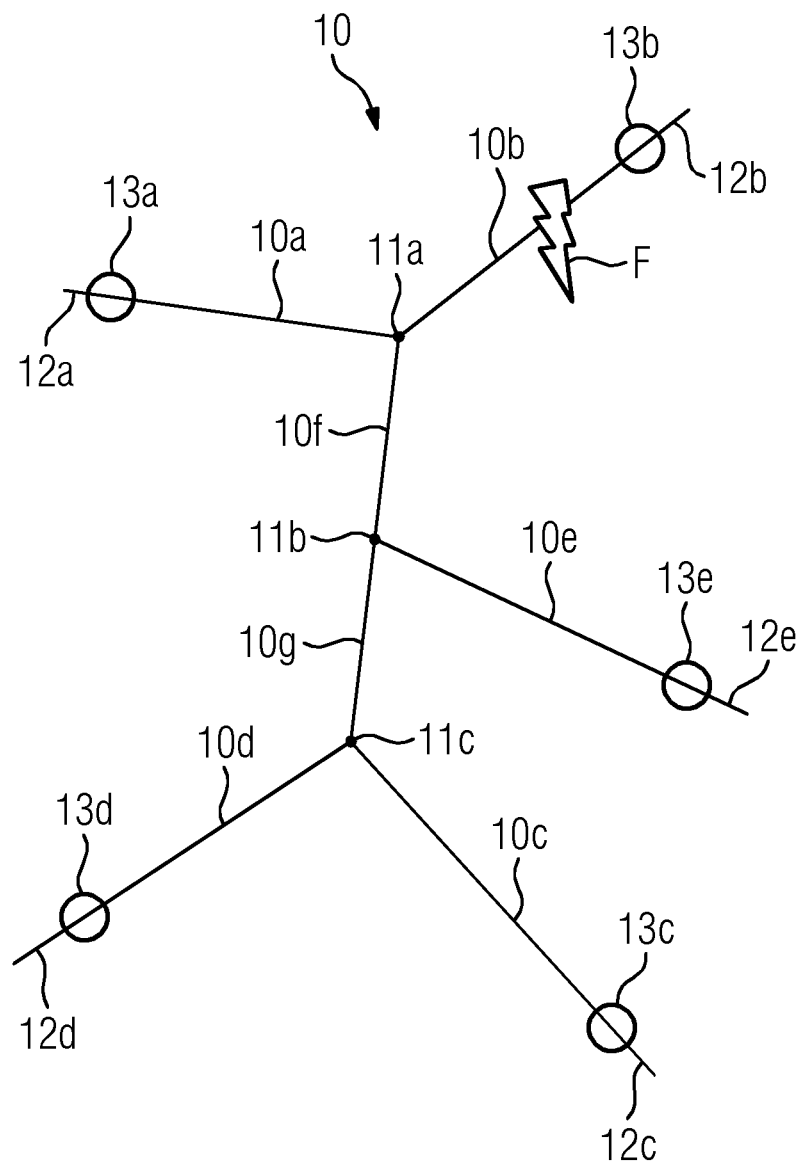
FIG. 2 is an illustration showing the line of the electrical power supply network with a plurality of node points and a plurality of line sections.

A more complex example of a branched line 10 is shown in FIG. 2. The line 10 of FIG. 2 contains five line ends 12a-e and three node points 11a-c, and is subdivided into 7 line sections 10a-g.

Such branched network topologies have recently become increasingly used in order, for example, to deal with the upgrading of distribution networks for the connection of decentral energy generators (PV systems, wind turbines, combined heat and power plants, etc.). Yet while in the case of lines with two line ends it is possible to carry out fault detection and fault position determination relatively simply by using conventional one-sided or two-sided fault location methods, the detection and locating of a fault in a branched topology entails greater difficulties. A method with which accurate fault position determination can be carried out even in such branched network structures will be presented below.

To this end, the network topology according to FIG. 2 is considered, and it is assumed that there is a fault F on the line section 10b. The fault position determination is carried out according to the principle of traveling waves, during which transient profiles in the measured currents and voltages are observed. Transient fault position determination has several advantages. One of these advantages is that the need for phasor calculation for the rated frequency is obviated. Particularly in the case of very short shutdown times of a network fault, transient fault location delivers more reliable results than phasor-based methods. Fault position determination by using transients furthermore delivers a more reliable result because of the analysis of a wider frequency spectrum. Particularly in the case of resonant-neutral grounded or isolated-neutral networks, transient fault location offers a high reliability of the results determined. Furthermore, transient fault location may also be used in networked topologies (so-called three-legged network topologies). The topology represented in FIG. 2 may be regarded as a nested three-legged network topology. In the example shown, it is assumed that currents and voltages can be measured at the five line ends 12a-e. For the measurement, devices are to be used which can carry out signal sampling with a relatively high sampling rate (for example 8-64 kHz). The reason for this is the need to register transients, i.e. high-frequency signal components, which cannot be recorded with conventional measuring devices having relatively low sampling rates. The recording may, for example, be carried out with a fault recorder or a protection apparatus. In the example of FIG. 2, it is furthermore assumed that no measuring devices are present at the three inner-lying node points 11a-c, so that no currents and voltages can be recorded there by measurement. The currents and voltages at the node points 11a-c must therefore be determined on the basis of the current and voltage measurement values recorded at the line ends 12a-e. This will be discussed in detail below.

Figure 3:
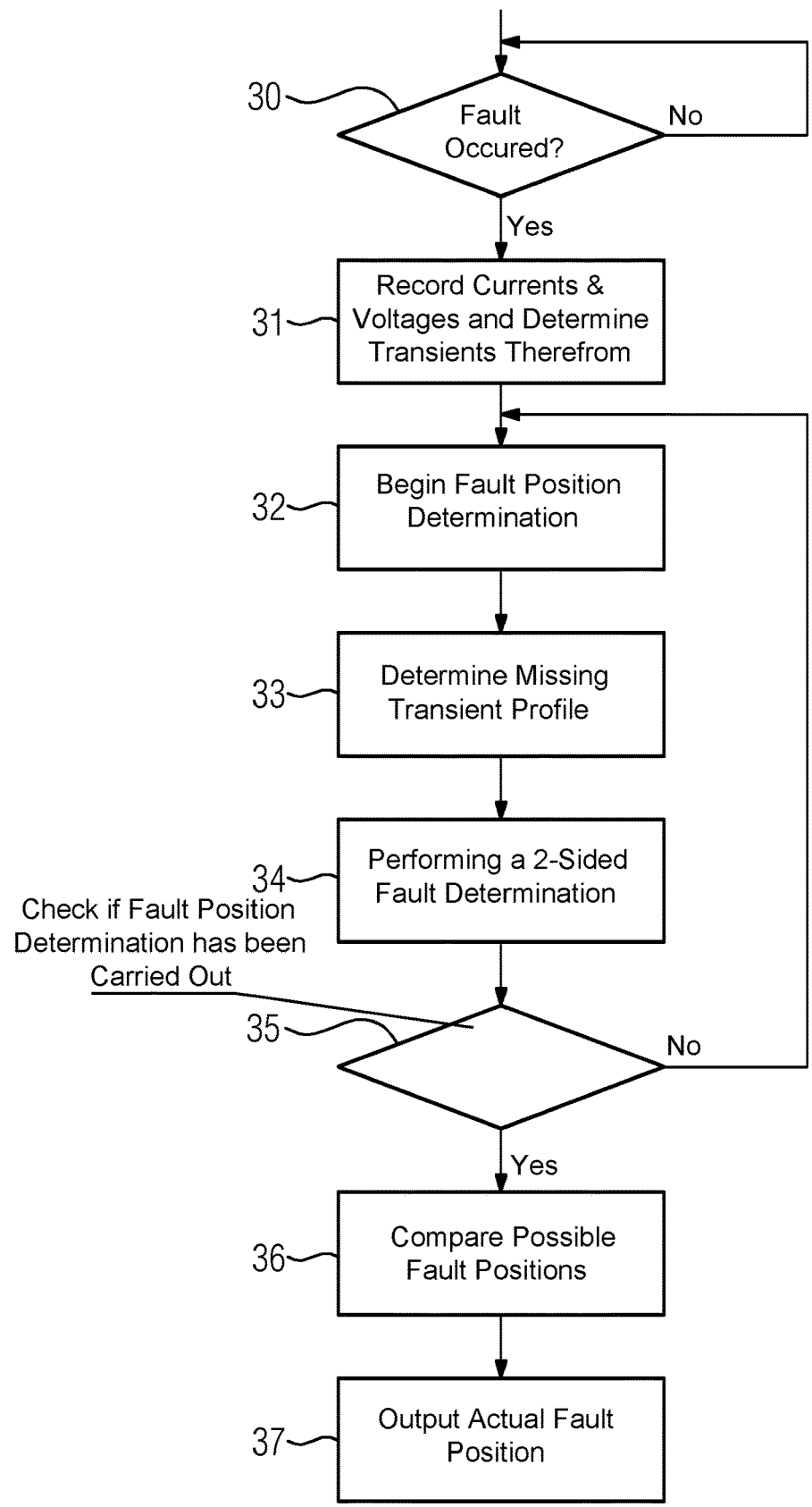
FIG. 3 is a flowchart for explaining one exemplary embodiment of a method for determining a fault position on a line.

In principle, the steps schematically shown in FIG. 3 are carried out in order to determine the fault position on a branched line. In a first step 30, continuous monitoring is initially carried out of whether a fault has occurred on the line 10. Such detection may be carried out by using widely known protection algorithms, which make a decision on the basis of measurement values as to whether the line is in a fault-affected state. For example, a distance protection algorithm, a differential protection algorithm, a current surge protection algorithm or another protection algorithm may be used for this. If no fault has been detected in step 30, the continuous monitoring is continued. If a fault has been detected, however, in a next step 31 currents and voltages are recorded at all available measurement sites (in the present example at the line ends 12a-e) and transient time profiles of current and voltage values are formed therefrom. As a result of step 31, a transient profile of current and voltage for a predetermined period of time after the fault occurrence is available for each measurement site.

In a subsequent step 32, the actual fault position determination begins. To this end, one of the line sections 12a-e, for which a possible fault position is determined, is initially selected. If the fault position can already be localized to one or more line sections, for example because of the evaluation of further measurements, for example evaluations of so-called fault indicators, a line section from this restricted set of line sections is selected in step 32. If localization still cannot be carried out, one of all existing line sections is selected in step 32.

If measured transient current and voltage values are not available at both ends of the selected line section, the missing transient profiles are determined with the aid of the existing measured profiles in a subsequent step 33. In this case, measurement values which have been recorded at the other end of the selected line section assumed to be faulty are respectively excluded.

Usually, as in the present example, measurement values will be available at the line ends but not at the node points. In order to determine the missing transient profiles of the node currents and voltages, on the one hand the measured profiles and on the other hand traveling wave models of the individual line sections are used. Such traveling wave models describe the propagation of current and voltage signals along an electrical conductor. The precise procedure during the determination of the transient profiles at the ends of the line sections at which no measurements are taken will be explained in more detail below.

In a further step 34, a two-sided fault position determination is carried out for the selected line section. To this end, a two-sided traveling wave fault position determination is carried out in the conventional way. An example of such a traveling wave fault position determination, as is also described in detail in published European patent application EP 3 193 420 A1, will be explained in brief below. Other examples which may be used for the determination of the fault position by using the traveling wave method are described in published European patent application EP 3 223 026 A1 and U.S. Pat. No. 8,655,609 B2.

As a result of the two-sided fault position determination in step 34, a possible fault position is available.

In a next step 35, a check is made as to whether, for all line sections on which the fault could exist, a fault position determination has already been carried out. If this is not the case, the next line section is selected with step 32. The method described above with the aid of steps 32 to 34 is subsequently carried out until the check in step 35 reveals that a possible fault position has been determined for all line sections on which the fault may exist.

As a result, after step 35, possible fault locations are therefore available for all line sections potentially affected by a fault. However, such a possible fault location coincides with the actual fault position only if the selected line section has actually been affected by a fault. The operator of the power supply network to which the branched line 10 belongs now has the opportunity to inspect all possible fault positions indicated. The outlay for determining the actual fault position is therefore already significantly reduced, since it is no longer necessary to observe the entire length of the line sections.

It is, however, optionally also possible to determine the actual fault position automatically from the set of possible fault positions indicated. To this end, in a further step 36, the results respectively formed in step 34 for determining the possible fault positions are compared with one another. In particular, target functions which have been used for determining the respective possible fault position are compared with one another with a view to which is the result most conclusively indicating an actually existing fault. In this context, for example, in the case of minimizing a target function, the global minimum of the target functions used may be evaluated as an indication of the actual fault position.

Lastly, in step 37 the actual fault position is output. The output may, for example, indicate the line section affected by a fault and an indication of the distance of the fault position from a reference site, for example the measurement site at the line end (in kilometers or as a percentage of the line section length).

Some of the steps mentioned in connection with FIG. 3 will be explained in more detail below. To this end, the branched line of FIG. 2 is again considered. First, the way in which the transient profiles of current and voltage for the node point's 11a-c of the line 10 may be calculated will be explained. This is because in order to be able to carry out fault location for the entire line 10, it is also necessary to determine the currents and voltages at the node points 11a-c not included in the measurements, because at the start of the fault position determination it is not certain where the fault actually lies. Each line section must there for be assumed to be potentially affected by a fault. Consequently, fault position determinations must be carried out for the seven existing line sections 10a-g. The fault position determination is carried out for each line section according to the traveling wave principle, as has been described for example in European patent application EP 3 193 420 A1. Transient profiles of current and voltage at both ends of a line section are respectively required there for. In the case of FIG. 2, there is no line section for which the transient profiles of current and voltage at its two ends can be determined by measurement, since no measuring apparatuses are installed at the node point's 11a-c. The transient profiles must therefore be calculated for the node points 11a-c. To this end, traveling wave models of the respective line sections are compiled. With the assumption that the parameters of the lines, such as characteristic impedance, propagation constant, are known, the traveling wave models are compiled by using the telegrapher's equations as so-called PI elements for a wide frequency spectrum. The following equations need to be used for this:

$$U_p(l, j\omega) = U_q(j\omega)\cosh\gamma(j\omega)l - Z_c(j\omega) \cdot I_q(j\omega)\sinh\gamma(j\omega)l$$

$$I_p(l, j\omega) = -U_q(j\omega)\frac{1}{Z_c(j\omega)}\sinh\gamma(j\omega)l - Z_c(j\omega) \cdot I_q(j\omega)\cosh\gamma(j\omega)l$$

Here, $U_p$ and $I_p$ stand for the desired profiles of voltage and current at the respectively considered node point and $U_q$ and $I_q$ stand for the voltages and currents determined by measurement at the respective line end. Furthermore, $\gamma$ denotes the propagation constant, Zc denotes the characteristic impedance and l denotes the length of the respectively modeled line section.

From the equations above, a so-called quadrupole may be constructed, by means of which, by using input signals—here the measurement quantities $U_q$ and $I_q$—it is possible to calculate the output signals—here the desired profiles $U_p$ and $I_p$—at an arbitrary point, indicated by the length l, of an electrical conductor. Formulated as an equation, a quadrupole may be represented as follows:

$$\begin{bmatrix} U_p \\ I_p \end{bmatrix} = \begin{bmatrix} \cosh\gamma l & -Z_c\sinh\gamma l \\ -\frac{\sinh\gamma l}{Z_c} & \cosh\gamma l \end{bmatrix} \cdot \begin{bmatrix} U_p \\ I_p \end{bmatrix}$$

These quadruples basically model a single-wire line with the return conductor. In order to be able to use the quadruples for coupled three-phase systems, they need to be decoupled, i.e. transformed into uncoupled single-phase systems. To this end, the so-called Clarke transformation (also referred to as a αβ0 modal transformation) may be used. In this case, each modal component may be considered separately. This technique is very effective particularly for symmetrical systems which occur in practice. In the case of highly asymmetrical systems, so-called eigenvalue analysis is to be used. In this case as well, the triple system is decomposed into three separate single-phase systems. These may then be analyzed independently of one another. Symmetrical systems will be assumed below.

Figure 4:
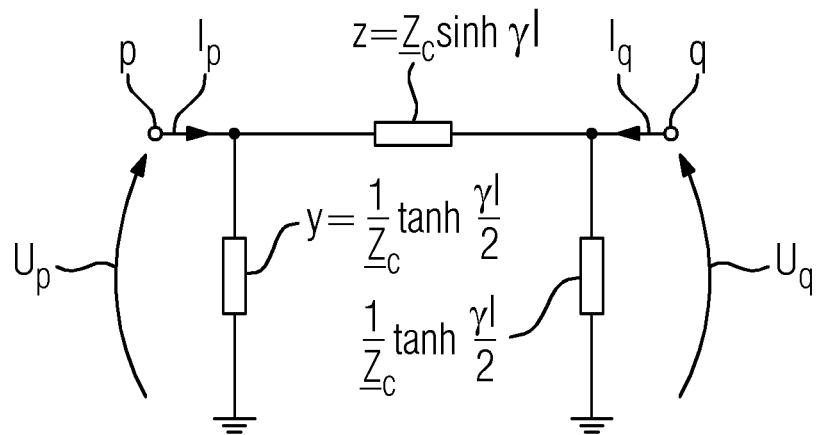
FIG. 4 is a schematic diagram of a quadruple as a PI element to explain the determination of transient profiles of current and voltage at a node point.

In order to be able to use quadruples effectively in three-legged network topologies, it is advantageous to model the line sections in the form of so-called PI elements. Such a quadruple in the form of a PI element is shown by way of example in FIG. 4. These PI elements are frequency-dependent and must be calculated for the relevant frequency spectrum. For each frequency considered, a description in Fourier space applies.

In order to obtain a complete image of current and voltage profiles in a network system, PI elements are to be used for each of the modal components (αβ0). This consideration may be simplified if only the fault position determination is carried out. It is then sufficient to work only with a selected modal component. The component to be selected depends on the type of fault.

The calculation method will be explained in more detail below with reference to an example. To this end, it is assumed that the fault lies on the line section 10b. Measurements of the line ends 12a-e are available. For the node points 11a-c, however, no measurements are available. In order to find the faulty line section and determine the fault position, the node voltages and node currents at the node point 11a also need to be determined. For this purpose, the node admittance method is used. For each line section considered, a new model system is respectively compiled, in which the respectively considered line section is eliminated. For the calculation of the node voltage and the node current at the node point 11a for the purpose of the fault position determination on the line section 10b, this line section 10b is consequently excluded from the modeling of the branched line 10. In order to determine the current and the voltage at the node point 11a, a node admittance matrix is compiled in such a way that the parameters connected with measurement values are placed at the first position of the matrix (currents and voltages of the line ends 12a and 12c-e; the line end 12b is eliminated for the calculation). At a further position, the parameters of the node points 11b and 11c not recorded by measurement, which are needed only indirectly for the fault position calculation, are placed.

At the last position, the parameters of the node point 11a, for which the current and voltage are intended to be determined, are placed. For the example considered, this leads to the following equation:

$$\begin{bmatrix} I_m \\ 0 \\ I_e \end{bmatrix} = \begin{bmatrix} y_{mm} & y_{mn} & y_{me} \\ y_{nm} & y_{nn} & y_{ne} \\ y_{em} & y_{en} & y_{ee} \end{bmatrix} \cdot \begin{bmatrix} U_m \\ U_n \\ U_e \end{bmatrix}$$

Here, the index m stands for the parameters of the quantities determined by measurement (line ends 12a, 12c-e), the index n stands for the quantities which cannot be determined by measurement but do not enter directly into the fault position determination of the line section considered (node points 11b, c), and the index e stands for the quantities to be determined (node point 11a). In this case, the matrix comprises a corresponding number of elements of each group m, n, depending on the topology.

The matrix of the admittance parameters y is known and may be established from the network structure as well as the PI elements. Since in the present case the node current $I_e$ to be determined is unknown but some of the voltages, namely the voltages $U_m$, are known, the node admittance matrix needs to be reformulated correspondingly:

$$\begin{bmatrix} U_m \\ U_n \\ U_e \end{bmatrix} = \begin{bmatrix} z_{mm} & z_{mn} & z_{me} \\ z_{nm} & z_{nn} & z_{ne} \\ z_{em} & z_{en} & z_{ee} \end{bmatrix} \cdot \begin{bmatrix} I_m \\ 0 \\ I_e \end{bmatrix}$$

Node points at which measurement is not carried out, and which do not represent an end of the line section to be checked for the fault, may be excluded from consideration, so that the impedance matrix is correspondingly simplified (as indicated by the cross in the matrix above). In this way, the calculation of the desired parameters $U_e$ and $I_e$ at the relevant node point is not impaired.

By inversion of the admittance matrix, the following equations are obtained, in which the impedances z are used:

$$U_m = z_{mm} I_m + z_{me} I_e$$

$$U_e = z_{mm} I_m + z_{ee} I_e$$

After using basic matrix operations, it can be established that the calculation of the unknown quantities $U_e$, $I_e$ may be carried out by the following two equations:

$$I_e = (z_{me}^T z_{me})^{-1} z_{me}^T (U_m - z_{mm} I_m)$$

$$U_e = z_{em} I_m + z_{ee} I_e$$

By using the currents and voltages measured at the line ends, it is therefore possible to determine the node currents and voltages (step 33 in FIG. 3). At the end of step 33, for each line section, the respectively required transient profiles of currents and voltages at its two ends are provided.

For the fault position determination, in step 34 a two-sided transient fault location algorithm is used. For this reason, the branched line 10 is reduced to a plurality of line sections, each with two ends. A situation such as is shown by way of example in FIG. 5 for the line section 10b therefore results for the respectively considered line section.

Figure 5:
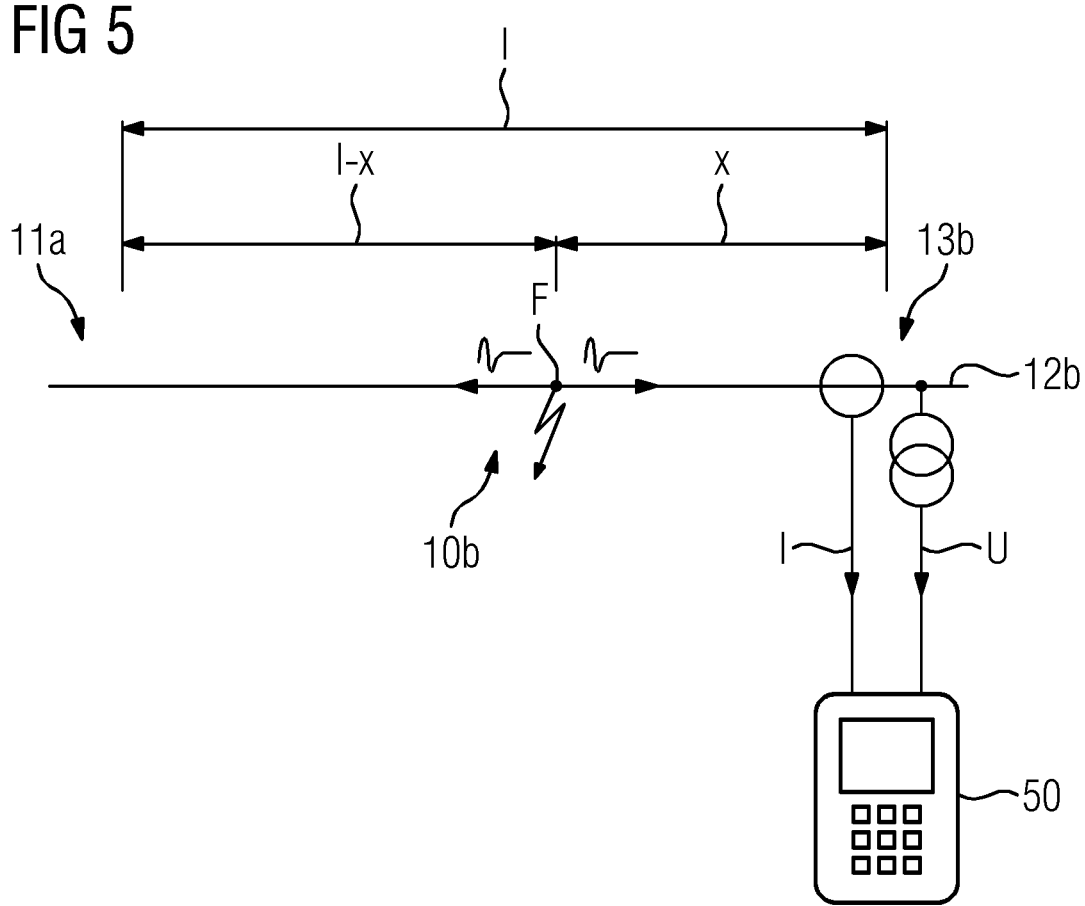
FIG. 5 is an illustration showing a line section with a device for determining a fault position.

According to FIG. 5, the line section 10b has a line end 12b at which a measurement site 13b is provided. At the measurement site 13b, transient profiles of currents and voltages are recorded by a device 50. The device 50 may, for example, be a protection apparatus or a fault recorder and record measurement values with a sufficiently high sampling rate (for example 8-64 kHz). At the other end of the line section 10b, there is the node point 11a, for which no measurements are available. Instead of the measured values, the profiles, calculated according to the procedure explained above, of the node voltage and the node current are used. When a fault occurs at the fault site F, a two-sided fault location may therefore be carried out using the measured profiles on the one hand, and the calculated profiles on the other hand. The two-sided fault location may be carried out according to a conventional traveling wave fault location algorithm. One possibility for the fault position determination will be presented briefly below.

Figure 6:
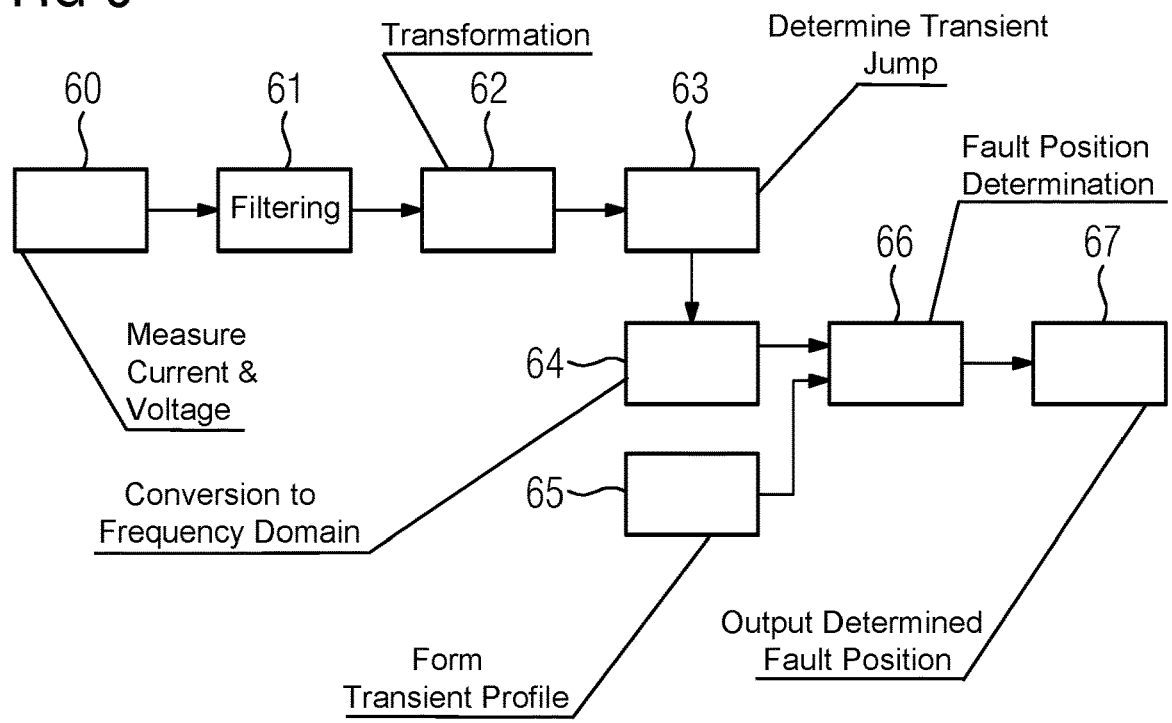
FIG. 6 is a schematic flowchart for explaining a procedure during a two-sided fault position determination.

In this regard, FIG. 6 shows a schematic flowchart of one exemplary embodiment of a two-sided fault position determination according to the traveling wave principle. In this case, the method steps above the dashed line take place in the device 50 at the line end 12b (cf. FIG. 5).

With the device 50, in step 60 the local currents and voltages are measured and corresponding current and voltage values are generated. The measurement values are provided as sampled values of the current and voltage signals of the line section 10b. So that only the high-frequency transient components (traveling waves) of the respective current or voltage measurement values are recorded, filtering is carried out in step 61 (for example by a bandpass filter). By selection of the cutoff frequencies, for example of the bandpass filter, the method may be adapted to the properties of the transformers. If these transformers provide only a medium bandwidth, for example only up to 10 kHz, the filter need to limit the bandwidth of the signals to the bandwidth of the transformers. Depending on the phase error of the transformers used, a somewhat lower measurement accuracy is then to be accepted. If the transformers can provide a greater bandwidth, for example up to 500 kHz, the filters should be dimensioned accordingly.

The traveling waves are treated in step 62 by a transformation (for example Clarke transformation), in order to decouple the phase-related components. In this case, transformed current and voltage values are generated.

In order to start the fault location method only when needed, i.e. in the event of a fault, and/or in order to position the measurement window correctly for the evaluation, a transient jump may furthermore be determined in step 63, which is for example used as a trigger for the measurement window positioning. The length of the measurement window should preferably be at least two times the propagation time of the traveling wave in the selected modal component. The jump detection may take place in relation to the transformed or the filtered current and voltage values, or also in terms of the original current and voltage measurement values.

In step 64, a conversion of the transformed current and voltage values into the frequency domain takes place. This is preferably done by means of a fast Fourier transform (FFT) or discrete Fourier transform (DFT).

In step 65, transient profiles of current and voltage, calculated for the node point 11a, are provided. These have been determined according to the method explained above and depict the profile of the node current and the node voltage in a corresponding way to the measurement values processed in steps 60 to 64.

The current and voltage profiles provided in steps 64 and 65 are delivered to a subsequent step 66.

In step 66, the device 50 carries out a fault position determination. To this end, for example, the fault voltage profiles $U_{F,1}$, $U_{F,2}$ obtained from the profiles for the two ends of the line section can be evaluated for an assumed fault position x on the line section:

$$U_{F,1}(x, j\omega) e^{-\gamma(j\omega)x} = \frac{U_1(j\omega) e^{-\gamma(j\omega)x} \cosh\gamma(j\omega)x - }{Z_c(j\omega) \cdot I_1(j\omega) e^{-\gamma(j\omega)x} \sinh\gamma(j\omega)x}$$

$$U_{F,2}(l-x, j\omega) e^{-\gamma(j\omega)(l-x)} = \frac{U_2(j\omega) e^{-\gamma(j\omega)(l-x)} \cosh\gamma(j\omega)(l-x) - }{Z_c(j\omega) \cdot I_2(j\omega) e^{-\gamma(j\omega)(l-x)} \sinh\gamma(j\omega)(l-x)}$$

However, since the actual fault position is initially unknown, it is necessary to find that value of x for which there is the best match of the two fault voltage profiles $U_{F,1}$, $U_{F,2}$. In other words, first, on the one hand, the profile of the fault voltage values $U_{F,1}$ for a first notional or assumed fault position needs to be determined from the line end 12b and, on the other hand, the profile of the fault voltage values $U_{F,2}$ for the same notional or assumed fault position needs to be determined from the node point 11a are determined. If the two profiles match, the first notional fault position would correspond to the actual fault position. If there is no match, the same procedure must be carried out for a next notional fault position. The procedure is continued until, for one notional fault position, a match of the two fault voltage profiles $U_{F,1}$, $U_{F,2}$ is established; this notional fault position then corresponds to the actual fault position.

The described procedure may advantageously be replaced with a mathematical optimization method in which a target function, with which the best match of the two fault voltage profiles can be determined as a function of the fault position, is set up. As a parameter for the target function, the distance x of the fault position from the line end 12b may be used. The following thus applies for the actual fault position:

$$(U_{F,1}(x,j\omega)e^{-\gamma(j\omega)x} - U_{F,2}(l-x,j\omega)e^{-\gamma(j\omega)(l-x)})_{\rightarrow}0.$$

In order to satisfy the condition, various target functions may be set up. One possible target function $ZF_1$, in the case of which a minimization is carried out for the optimization, is specified by the equation presented below:

$$ZF_1 = \min\int_{\omega}(U_{F,1}(x,j\omega)e^{-\gamma(j\omega)x} - U_{F,2}(l-x,j\omega)e^{-\gamma(j\omega)(l-x)})^2.$$

Another possible target function $ZF_2$, in the case of which a maximization is carried out for the optimization, is specified below by an equation:

$$ZF_2 = \max\int_{\omega}(U_{F,1}(x,j\omega)e^{-\gamma(j\omega)x} \cdot (U_{F,2}(l-x,j\omega)e^{-\gamma(j\omega)(l-x)})^*).$$

In this case, the asterisk * denotes the complex conjugate term.

The equations referred to above represent exemplary target functions, which must be subjected to a minimization or maximization process. This may, for example, be solved by an iterative mathematical method. The minimization or maximization process may be carried out both in the frequency and in the time domain, the calculation of the fault voltage profiles preferably taking place in the frequency domain. Since operation is usually carried out with discrete values in digital apparatuses such as the device 50, the methods may be adapted according to this requirement.

In this case, in step 66, for example, the aforementioned target functions can be processed. As described above, a possible fault position for which the target function of the line section considered has a minimum or a maximum is sought.

In step 67, the fault position determined is then output. The device 50 conventionally has a computing device in which steps 60 to 67 are carried out. This may, for example, be a microprocessor which accesses corresponding apparatus software that is contained in a memory of the respective device. As an alternative, it may also be a computing module with programming determined by hardware, for example an ASIC or FPGA. Instead of the device 50 which is arranged close to the process, i.e. in the vicinity of the measurement site of the line section, the determination of the possible fault position may also be carried out in a remotely arranged central data processing device. The latter may also be formed by a cloud computing system which offers the fault position determination as a service.

For each line section, the determination of a possible fault position is carried out in the manner described above. To this end a specific target function is respectively formed for the line section in question and subjected to the optimization. In order to identify the actual fault position, the results of the individual fault position determinations are then compared with one another. To this end, all the target functions are combined and a global extremum is determined. This extremum indicates the line affected by a fault as well as the actual fault position.

Figure 7:
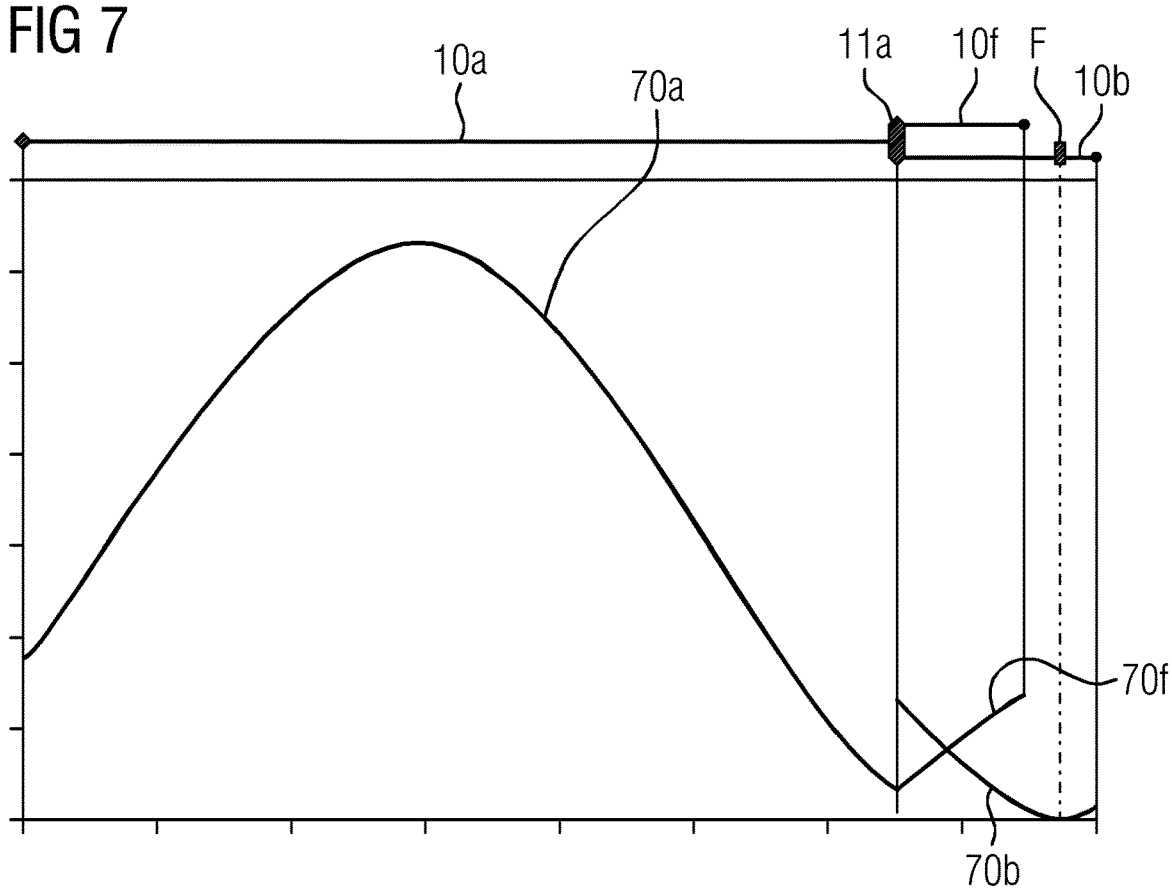
FIG. 7 is a graph showing a profile of a target function for determining a fault position in the case of a line with three line ends.

This procedure may be explained with the aid of FIG. 7. FIG. 7 shows a diagram in which, by way of example for the line sections 10a, 10b and 10f (cf. FIG. 2), the profiles of the analyzed target functions are represented. These line sections meet at the node point 11a. The profile of the target function over the line section 10a is denoted by the reference 70a. In a corresponding way, the profiles of the target functions for the line sections 10b and 10f are designated by the references 70b and 70f. During the comparison of the profiles of the three target functions, it can be seen that the profile 70b has a global minimum. This minimum indicates the actual fault position F. By comparison of the target functions considered, that which most conclusively points to an actually existing fault may therefore be selected. The possible fault position indicated by this profile is used as the actual fault position.

It may also occur that some or all of the line sections are segmented, i.e. they are composed partially of cables extending underground and partially of overhead lines. The individual segments are designated by different parameters. The way in which corresponding traveling wave models may also be set up for such segmented line sections will be described briefly below. In this case, two possible variants are described.

In the first variant, it is assumed that the node admittance matrix to be calculated is composed of individual transmission lengths which are free of any short circuit. The mixed lengths may then be represented in the form of a PI element. Each length may be described by a separate quadrupole in the form of so-called chain parameters:

$$\begin{bmatrix} \cosh\gamma l & -Z_c\sinh\gamma l \\ -\dfrac{\sinh\gamma l}{Z_c} & \cosh\gamma l \end{bmatrix} \rightarrow \begin{bmatrix} A & -B \\ -C & D \end{bmatrix}.$$

Figure 8:
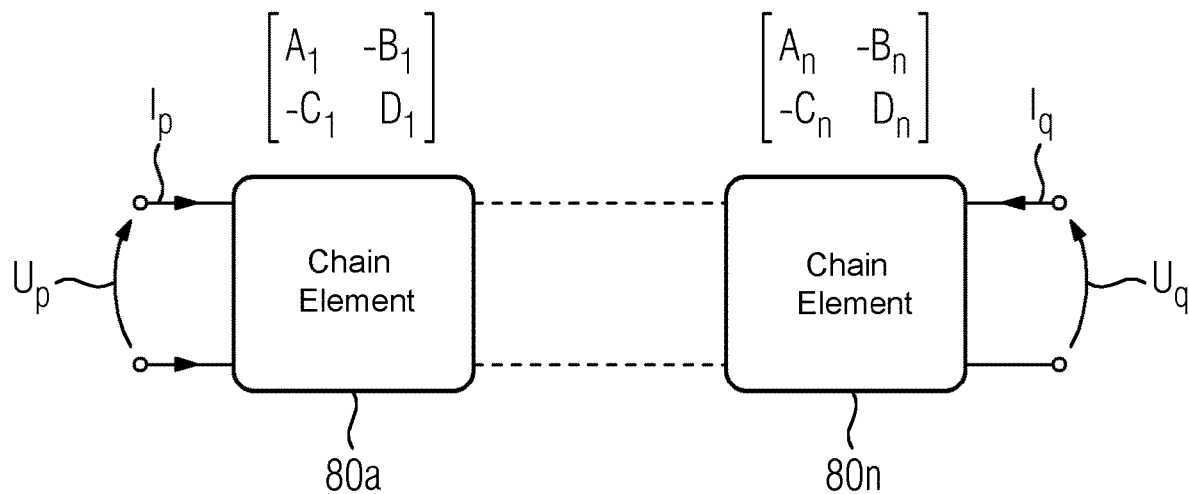
FIG. 8 is an illustration showing a simplified line model of a line with mixed line segments.

In the case of such mixed lengths, the description of the traveling wave model may be carried out as represented in FIG. 8. For each segment 1 . . . n, a chain element 80a . . . 80n with respective chain parameters $A_a$, $B_a$, $C_a$, $D_a$ . . . $A_n$, $B_n$, $C_n$, $D_n$ is generated from the corresponding line parameters. In order to represent the overall line section, the following equation may be used, which expresses the product of the matrices with their chain parameters:

$$\begin{bmatrix} U_p \\ I_p \end{bmatrix} = \begin{bmatrix} A_1 & -B_1 \\ -C_1 & D_1 \end{bmatrix} \cdot \ldots \cdot \begin{bmatrix} A_n & -B_n \\ -C_n & D_n \end{bmatrix} \cdot \begin{bmatrix} U_q \\ I_q \end{bmatrix}.$$

This leads to a quadruple which depicts the entire mixed length:

$$\begin{bmatrix} U_p \\ I_p \end{bmatrix} = \begin{bmatrix} A & -B \\ -C & D \end{bmatrix} \cdot \begin{bmatrix} U_q \\ I_q \end{bmatrix}.$$

Figure 9:
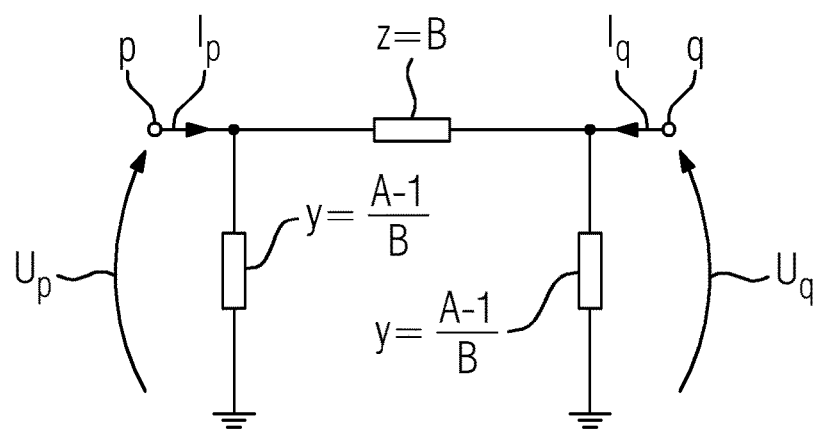
FIG. 9 is a schematic illustration showing a quadruple as a PI element for the modeling of a line with mixed line segments.

From the quadruple, a PI element may be set up, as is represented by way of example in FIG. 9. This may be used as described above for modeling the respective line section.

In the second alternative, it is assumed that the fault location is carried out on a line section which is not depicted by means of a node admittance matrix. This line section is then regarded as the line affected by a fault. After the calculation of the current and voltage quantities of the sites relevant for the fault position calculation, the estimation of the voltage at the theoretical fault position is carried out. This estimation is carried out over the entire line while taking segments into account.

Figure 10:
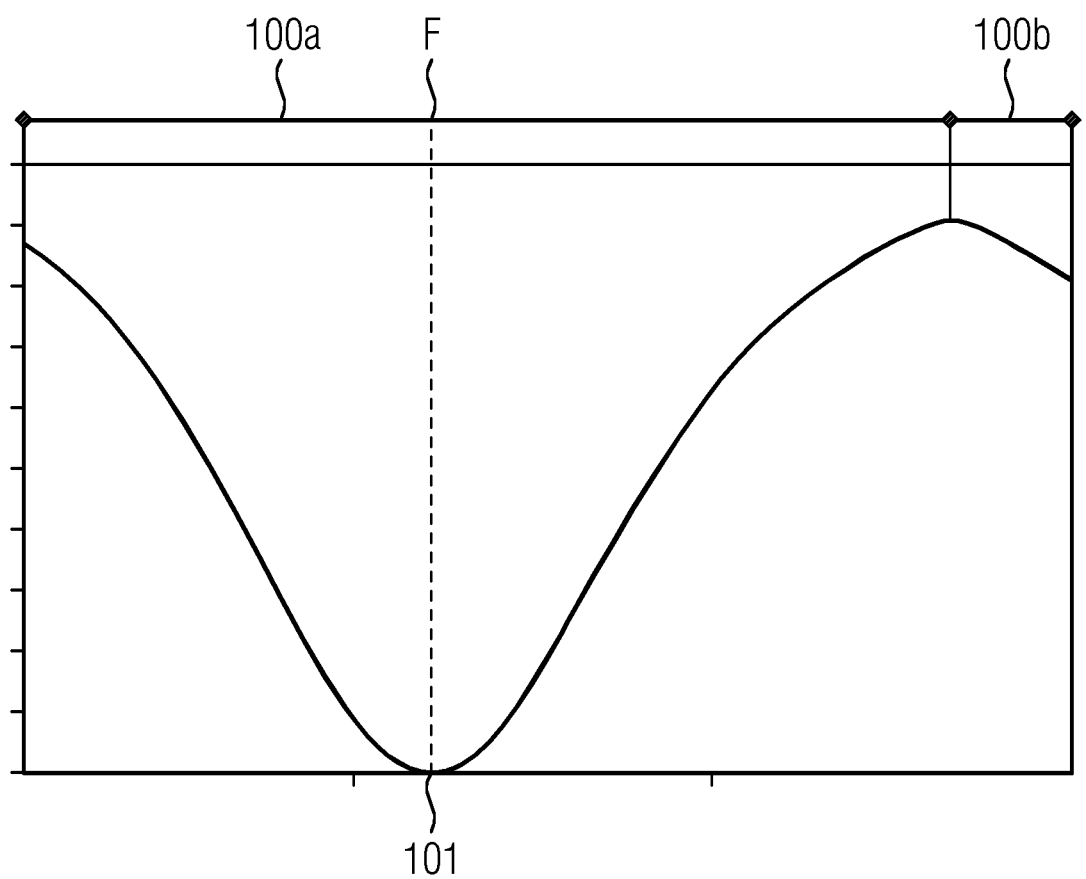
FIG. 10 is a graph showing a profile of a target function for determining a fault position in the case of a line with mixed line segments.

FIG. 10 shows the way in which the target function behaves for the estimation of the fault position on a line section with two segments 100a, 100b. A minimum 101, which allows the fault position to be deduced, can be seen clearly.

In summary, the present invention describes a method in which a fault position determination is carried out in relation to a branched line by using transients when current and voltage signals cannot be measured at all relevant sites, in particular at the node points. The method therefore simplifies the upgrading of existing networks, in particular the use of a plurality of line branches, for which no comparably reliable method for fault location has previously been available. The method therefore allows problem solutions in upgrading with renewable energies, in particular the effective and economical connection of decentral generation to existing networks.

To this end, for a branched line to be monitored, the missing current and voltage signals of node points, from which no measurement signals are available, are formed from the existing measurement signals. To this end, for all node points for which no measurement signals are available, the measurement signals need to be determined with the aid of the existing measurements. In order to form the missing measurement signals, a traveling wave model is used, preferably according to the node admittance method. Furthermore, successively, a line section is selected, for the ends of which either the existing measurement signals are used or the signals are formed as described from the measured measurement signals. With the measurement signals now available of both ends of the line section, a method for two-sided fault location may then be used. From observation of the respective extrema of the respective target functions, the actual fault position may finally be deduced with the aid of the absolute (global) extremum.

Although the invention has been illustrated and described above in detail with the aid of preferred exemplary embodiments, the invention is not restricted by the examples disclosed, and other variants may be derived therefrom by the person skilled in the art without departing from the protective scope of the appended patent claims.

The invention claimed is:

1. A method for determining a fault position of a fault on a line of an electrical power supply network being a three-phase line, the line having line sections with line ends including a first three-phase line section with a first line end, a second three-phase line section with a second line end, and at least one further three-phase line section with a further line end, the first, second and further line sections each being a part of the three-phase line, and at least one node point at which more than two of the line sections meet, which comprises the steps of:
   measuring transient profiles of current and voltage values at the line ends of the line by means of measuring devices after an occurrence of the fault on the line;
   determining transient profiles of a node current and a node voltage at the at least one node point by using at least the current and voltage values of a line end as well as a traveling wave model for a respective line section of the line sections, during a determination of the node current and the node voltage, the current and voltage values of the line end which delimits a respectively considered line section are excluded;
   performing, for each of the line sections, a two-sided fault position determination by using a transient profile of the current and voltage values measured at the line end and, the node current and the node voltage as well as the traveling wave model for the respective line section.

2. The method according to claim 1, which further comprises carrying out the fault position determination with an aid of a time difference with which a current or voltage edge of a traveling wave arrives at the two ends of the respective line section.

3. The method according to claim 1, which further comprises determining respectively possible fault positions by means of the fault position determination for individual ones of the line sections, and that a possible fault position for which the fault position determination most clearly indicates a fault existing at a particular location in comparison with other possible fault positions is selected as an actual fault position.

4. The method according to claim 3, wherein for the fault position determination, for each of the line sections a check is made as to whether there is a position over a length of the line section at which time profiles, calculated from the two ends of the line section, of a voltage existing at a location and/or of a current existing at a location match, and such a location is used as the possible fault position for the respective line section.

5. The method according to claim 4, which further comprises carrying out a determination of the possible fault position by means of an optimization method, the fault position being used as an optimization variable of a target function of the optimization method.

6. The method according to claim 5, wherein:
   minimization of the target function in a form of a difference of the time profiles calculated from the ends of the respective line section is carried out, and that a location at which the target function assumes a minimum is regarded as the possible fault position on the respective line section; or
   maximization of the target function in a form of a product of the time profile of one end of the respective line section and a complex conjugate profile of the time profile of the other end of the line section is carried out, and that the location at which the target function assumes a maximum is regarded as the possible fault position on the respective line section.

7. The method according to claim 5, wherein profiles of target functions of all the line sections are compared with one another, and that the possible fault position whose target function has a global extremum in comparison with the target functions of other possible fault positions is selected as the actual fault position.

8. The method according to claim 1, wherein:
   in a case of the line having more than one node point, the transient profiles of a respective node current and of a respective node voltage are determined for each node point; and
   the two-sided fault position determination is carried out on the line sections lying between two node points by using the transient profiles, determined for the respective node points, of the node current and of the node voltage.

9. The method according to claim 1, wherein the node current and the node voltage, in a case of a line section which is configured partially as an overhead line and partially as an underground cable, are determined with an aid of the traveling wave model which takes into account line parameters both of the overhead line and of the underground cable.

10. The method according to claim 1, which further comprises subjecting the current and voltage values measured at the line ends to filtering, filtered current and voltage values being formed, which indicate a selected frequency range of the current and voltage values measured which contains high-frequency transient components or band-limited transient components of the current and voltage values measured.

11. The method according to claim 10, wherein a filter characteristic of a filter used for filtering the current and voltage values attenuates those frequency ranges in which current or voltage transformers used for measuring the current and voltage measurement values have measurement errors.

12. The method according to claim 1, wherein the current and voltage values at the line ends are recorded by sampling analog current and voltage signals with a sampling frequency above a fundamental frequency of analog current and voltage signals.

13. The method according to claim 12, which further comprises performing the recording step using a sampling rate of between 8 kHz and 64 kHz.

14. A device for determining a fault position of a fault on a line of an electrical power supply network being a three-phase line, the line having line sections with line ends including a first three-phase line section with a first line end, a second three-phase line section with a second line end and at least one further three-phase line section with a further line end, the first, second and further line sections each being a part of the three-phase line, as well as at least one node point, at which more than two of the line sections meet, the device comprising:

a measuring configuration adapted to measure transient profiles of current and voltage values at a line end of the line;

a computing device being adapted, by using the transient profiles, measured by the measuring configuration, of the current and voltage values, after an occurrence of the fault on the line, to determine the fault position of the fault;

said computing device being adapted to determine transient profiles of a node current and a node voltage at the at least one node point by using at least the current and voltage values of the line end as well as a traveling wave model for a respective line section, and during a determination of the node current and the node voltage, excluding the current and voltage values of the line end which delimits a respectively considered line section; and said computing device adapted, for each of the line sections, to carry out a two-sided fault position determination by using a transient profile of the current and voltage values measured at a line end and, the node current and the node voltage as well as the traveling wave model for the line section.

15. A system for determining a fault position of a fault on a line of an electrical power supply network being a three-phase line, the line having line sections with line ends including a first three-phase line section with a first line end, a second three-phase line section with a second line end and at least one further three-phase line section with a further line end, the first, second and further line sections each being a part of the line being the three-phase line, as well as at least one node point, at which more than two of the line sections meet, the system comprising:

a plurality of measuring devices according to claim 14, said measuring devices being adapted to measure the transient profiles of the current and voltage values at the line ends of the line;

at least one computing device which is adapted, by using the transient profiles of the current and voltage values, after an occurrence of the fault on the line, to determine the fault position of the fault;

said computing device adapted to determine transient profiles of a node current and a node voltage at the at least one node point by using at least the current and voltage values of a line end as well as a traveling wave model for a respective line section; and said computing device adapted, for each of the line sections, to carry out a two-sided fault position determination by using the transient profile of the current and voltage values measured at a line end and, the node current and the node voltage as well as a traveling wave model for the line section.

* * * * *